United States Patent
Hsu

(10) Patent No.: US 7,614,030 B2
(45) Date of Patent: Nov. 3, 2009

(54) SCATTERING BAR OPC APPLICATION METHOD FOR MASK ESD PREVENTION

(75) Inventor: Chien-Ping Hsu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 449 days.

(21) Appl. No.: 11/332,928

(22) Filed: Jan. 17, 2006

(65) Prior Publication Data

US 2007/0166626 A1 Jul. 19, 2007

(51) Int. Cl.
*G06F 17/50* (2006.01)
(52) U.S. Cl. ............................................. 716/19
(58) Field of Classification Search .............. 716/19–21
See application file for complete search history.

(56) References Cited

U.S. PATENT DOCUMENTS

| | | | | |
|---|---|---|---|---|
| 5,892,261 | A * | 4/1999 | Lin et al. ..................... | 257/355 |
| 6,857,109 | B2 * | 2/2005 | Lippincott ..................... | 716/2 |
| 7,302,672 | B2 * | 11/2007 | Pack et al. ..................... | 716/19 |
| 2003/0013258 | A1 * | 1/2003 | Lee ............................. | 438/298 |
| 2005/0177810 | A1 * | 8/2005 | Heng et al. .................... | 716/21 |
| 2005/0208396 | A1 * | 9/2005 | Lippincott ..................... | 430/30 |
| 2006/0240331 | A1 * | 10/2006 | O'Brien et al. ................ | 430/5 |
| 2007/0090410 | A1 * | 4/2007 | Chen .......................... | 257/223 |
| 2007/0128525 | A1 * | 6/2007 | Wallace et al. ................ | 430/5 |
| 2007/0128526 | A1 * | 6/2007 | Wallace et al. ................ | 430/5 |

OTHER PUBLICATIONS

TW Office Action mailed Jul. 8, 2009.

* cited by examiner

*Primary Examiner*—Stacy A Whitmore
(74) *Attorney, Agent, or Firm*—Thomas, Kayden, Horstemeyer & Risley

(57) ABSTRACT

A method for reducing ESD on scattering bars in forming a mask containing a target pattern is provided. In one embodiment, the target pattern comprising features to be imaged onto a substrate is obtained. The mask is modified to include at least one scattering bar, the at least one scattering bar being placed adjacent to edges of the features to be imaged. Thereafter, the scattering bar is truncated into one or more scattering bar segments by determining an optimized length for each of the one or more scattering bar segments, wherein ESD on the one or more scattering bar segments is substantially reduced.

15 Claims, 3 Drawing Sheets

SCATTERING BAR OPC APPLICATION METHOD FOR MASK ESD PREVENTION

BACKGROUND

The present invention relates generally to photolithography, and more particularly, to an improvement in optical proximity correction (OPC) by utilizing an improved scattering bar design, as well as a new method for implementing scattering bars in a mask design.

In photolithographic processing, ever finer geometric patterns corresponding to the circuit components must be imaged from a mask onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. The design rule limitations are typically referred to as "critical dimensions" (CD). A critical dimension of a circuit can be defined as the smallest width of a line or the smallest space between two lines. Thus, the CD determines the overall size and density of the designed circuit.

Of course, one of the goals in integrated circuit fabrication is to faithfully reproduce the original circuit design on the wafer (via the mask). Currently, various optical proximity correction (OPC) techniques are utilized to allow the resulting image to more accurately correspond to the desired target pattern. The OPC can be carried out by means of a simulation program or a rule-based software system.

A common OPC technique, which is widely known, is the use of subresolution assist features, or scattering bars. Scattering bars, or thin lines, are attached between structures in order to improve the sharpness of the imaging in lithography. These lines are so thin that they are not imaged on the substrate themselves. Scattering bars correct for optical proximity effects and have been shown to be effective for increasing the overall process window (i.e., the range of focus and exposure dose variation over which features having some specified CD can be printed consistently, regardless of whether or not the features are isolated or densely packed relative to adjacent features.). Generally speaking, the optical proximity correction occurs by improving the depth of focus for the less dense to isolated features by placing scattering bars near those features. Typically, they are arranged parallel to parts of the structure at predeterminable intervals. The scattering bars function to change the effective pattern density (of the isolated or less dense features) to be more dense, thereby negating the undesirable proximity effects associated with printing of isolated or less dense features. It is important, however, that the mask also contain scattering bars, which cannot be imaged onto the substrate by exposure owing to their small dimensions. But they support the imaging of the main structures.

Notwithstanding the widespread use of scattering bars, there remain problems associated with current scattering bar OPC technology when utilized for patterning feature dimensions. Current scattering bar OPC model may generate scattering bars having long lengths. Scattering bars having long lengths pose an electrostatic discharge (ESD) problem in that electric charge often accumulates on the longer scattering bar. FIG. 1 shows a portion of a mask layout and illustrates the problem of ESD resulting from the application of scattering bars utilizing currently known methods of applying scattering bars to a mask design. As shown, the mask layout includes features 10 and scattering bars 20 having long lengths with electric charge 30 accumulated thereon.

When the accumulated electric charge 30 overloads and discharges, the scattering bar is typically damaged or deformed. This results in an unwanted extra pattern printed out on the substrate. Due to the ESD issue in masks, mask retooling and verification costs are increased as new masks need to be made and the risks of yield losses and wafer scraps are also increased. As device pattern sizes become smaller and smaller, the ESD problem becomes more and more pronounced.

For these reasons and other reasons that will become apparent upon reading the following detailed description, there is a need for a method of providing scattering bars in a mask which overcomes the foregoing problems so as to allow for mask ESD prevention and improved OPC and printing performance.

SUMMARY

The present invention is directed to a method for reducing ESD on scattering bars in forming a mask containing a target pattern. In one embodiment, the target pattern comprising features to be imaged onto a substrate is obtained. The mask is modified to include at least one scattering bar, the at least one scattering bar being placed adjacent to edges of the features to be imaged. Thereafter, the scattering bar is truncated into one or more scattering bar segments by determining an optimized length for each of the one or more scattering bar segments, wherein ESD on the one or more scattering bar segments is substantially reduced.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

In the following description, numerous specific details are set forth to provide a thorough understanding of the present invention. However, one having an ordinary skill in the art will recognize that the invention can be practiced without these specific details, that the present invention is not limited to the depicted embodiments, and that the present invention may be practiced in a variety of alternate embodiments. In some instances, well-known methods, procedures, and components have not been described in detail to avoid unnecessarily obscuring the present invention.

Parts of the description will be presented using terminology commonly employed by those skilled in the art to convey the substance of their work to others skilled in the art. Also, parts of the description will be presented in terms of operations performed through the execution of programming instructions. As well understood by those skilled in the art, these operations often take the form of electrical, magnetic, or optical signals capable of being stored, transferred, combined, and otherwise manipulated through, for instance, electrical components.

In accordance with the optical proximity correction technique of the present invention, there is provided a method and technique for modifying a mask layout to include segmented scattering bars, which decreases the amount of ESD on the scattering bars.

Figure 2:
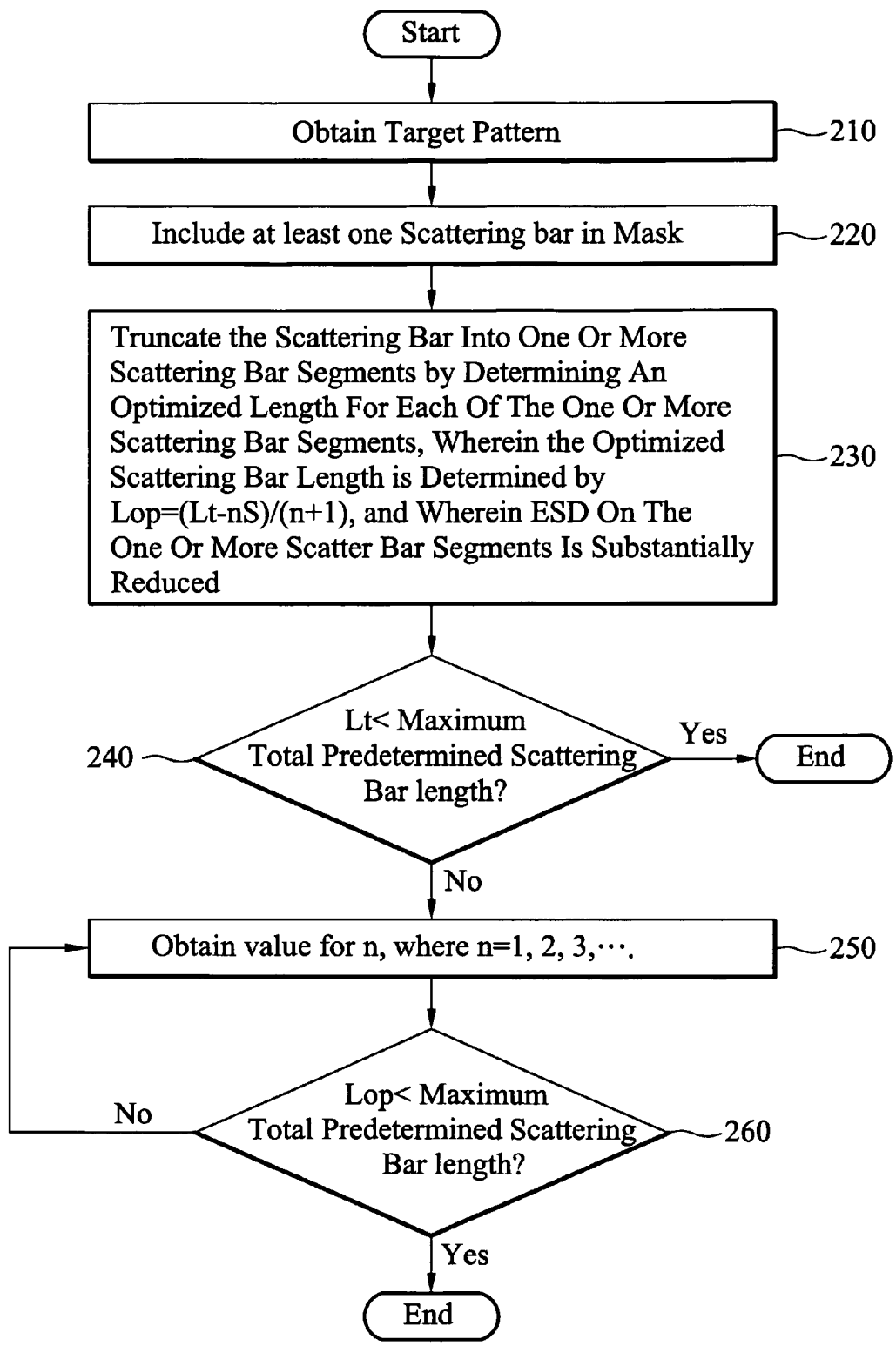
FIG. 2 is an exemplary flow chart which sets forth the method of applying scattering bars to a mask layout in accordance with the present invention.

FIG. 2 is an exemplary flow chart which sets forth the method of applying scattering bars to a mask layout in accordance with the present invention. The first step 210 is to obtain the desired pattern (i.e., target pattern) comprising features to be imaged onto a substrate. The target pattern may contain different shaped features, such as for example, vertical features and horizontal features. The next step 220 is to modify the mask to include at least one scattering bar, where the at least one scattering bar is placed adjacent to the edges of features to be imaged. As those skilled in the art understands, a number of conventional approaches can be used to assign scattering bars to particular edges. One approach that is often used is a rule-based approach that assigns scattering bars based on spacing classification. That is, all edges having a certain spacing classification in a design are assigned the same type of scattering bar enhancement. Spacing classification can be used to define whether or not an edge receives scattering bar enhancement at all, as well as the number of scattering bars, the spacing of scattering bars, and the width of scatter bars. Spacing classification and scattering bar enhancement parameters can all change depending on the photolithographic process being used, design constraints, designer preference, and the like.

Once the scattering bars have been generated, the next step 230 is to truncate each scattering bar into one or more shorter segments whereby an optimized length is determined for each of the one or more scattering bar segments such that ESD on the one or more scattering bar segments is substantially reduced. As will be understood below, some scattering bars, due to their respective lengths, will not be subject to this truncation step as defined by the equation below, and consequently, will not be truncated into one or more scattering bar segments.

The optimized scattering bar length, $L_{op}$ is determined by the Equation (1):

$$Lop=(L_t-nS)/(n+1) \quad \text{Equation (1)}$$

where $L_t$ is the total scattering bar length, n is the number of spaces between the scattering bar segments, and S is the minimum space between scattering bar segments.

To illustrate an application of Equation (1), an example with reference to 90 nm generation node will be shown. As previously stated, the accumulated electrical charge on scattering bars which is responsible for the ESD problem in masks is in part dependent upon the length of the scattering bar. The longer the length, the more the electrical charge accumulated, and conversely, the shorter the length, the less the electrical charge. Design constraints include a minimum spacing between features and a minimum total scattering bar length. According to the current design rule for 90 nm processing, the minimum space between scattering bar segments is about 140 nm. If the scattering bar features are too close, they may bleed together in the projected image, possibly causing problems such as short circuits. The minimum total scattering bar length is about 180 nm; a length shorter than about 180 nm and it may not be possible to create the physical scattering bar feature in the mask. The inventor has determined that the maximum total scattering bar length for 90 nm node, the length at which the ESD on the scattering bar is not substantially reduced, is about 900 nm. Therefore, going back to FIG. 2, with respect to step 240, if the total scattering bar length $L_t$ is less than about 900 nm, the process ends, Equation (1) is not applicable and the scattering bar will not be truncated into one or more scattering bar segments. If no, if the total scattering bar length $L_t$ is not less than about 900 nm, then Equation (1) applies and the process continues to step 250, where a value is obtained for n to determine the optimized scattering bar length $L_{op}$.

Figure 1:
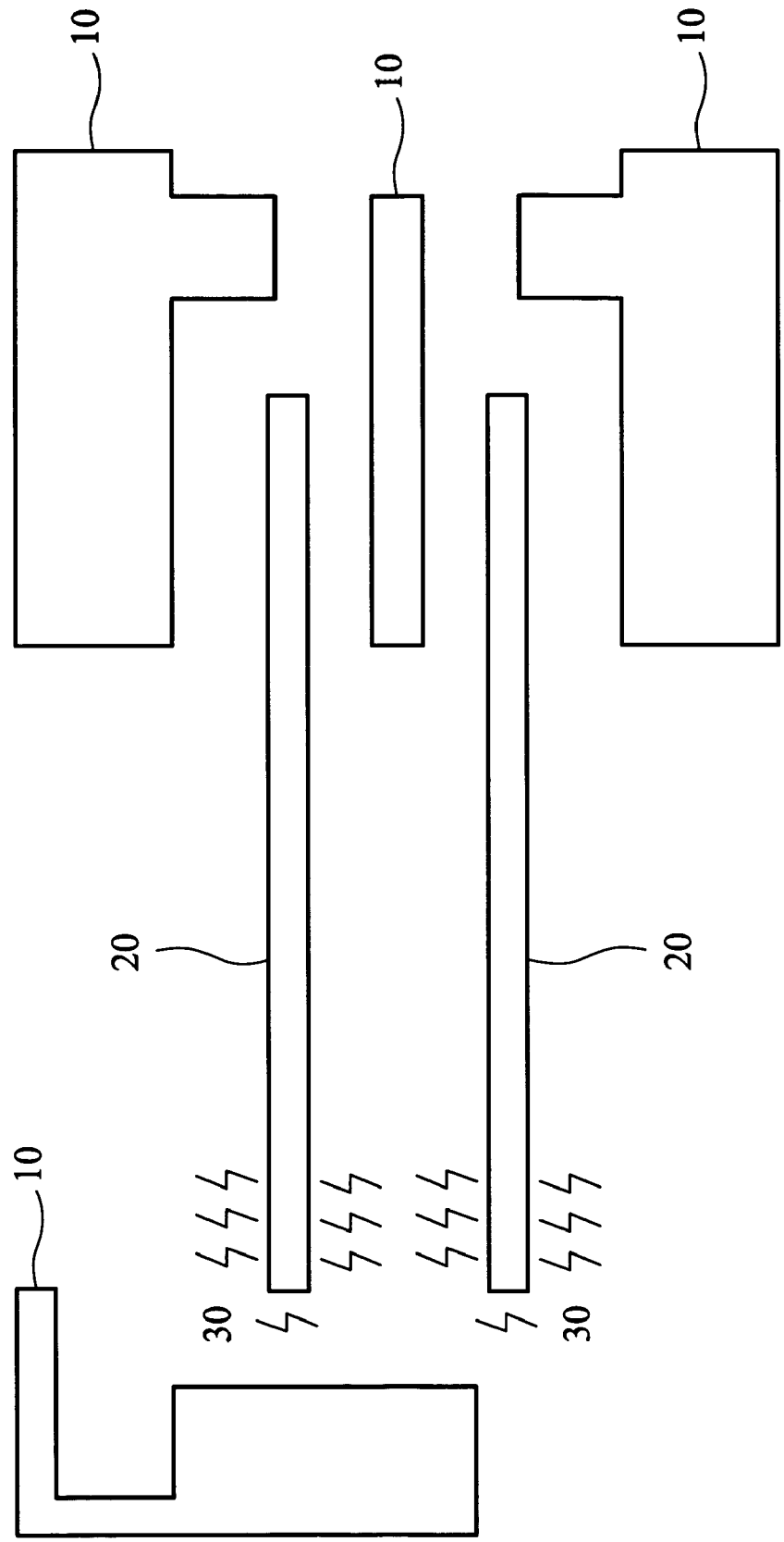
FIG. 1 shows a portion of a mask layout and illustrates the problem of ESD resulting from the application of scattering bars utilizing currently known methods of applying scattering bars to a mask design.
Figure 3:
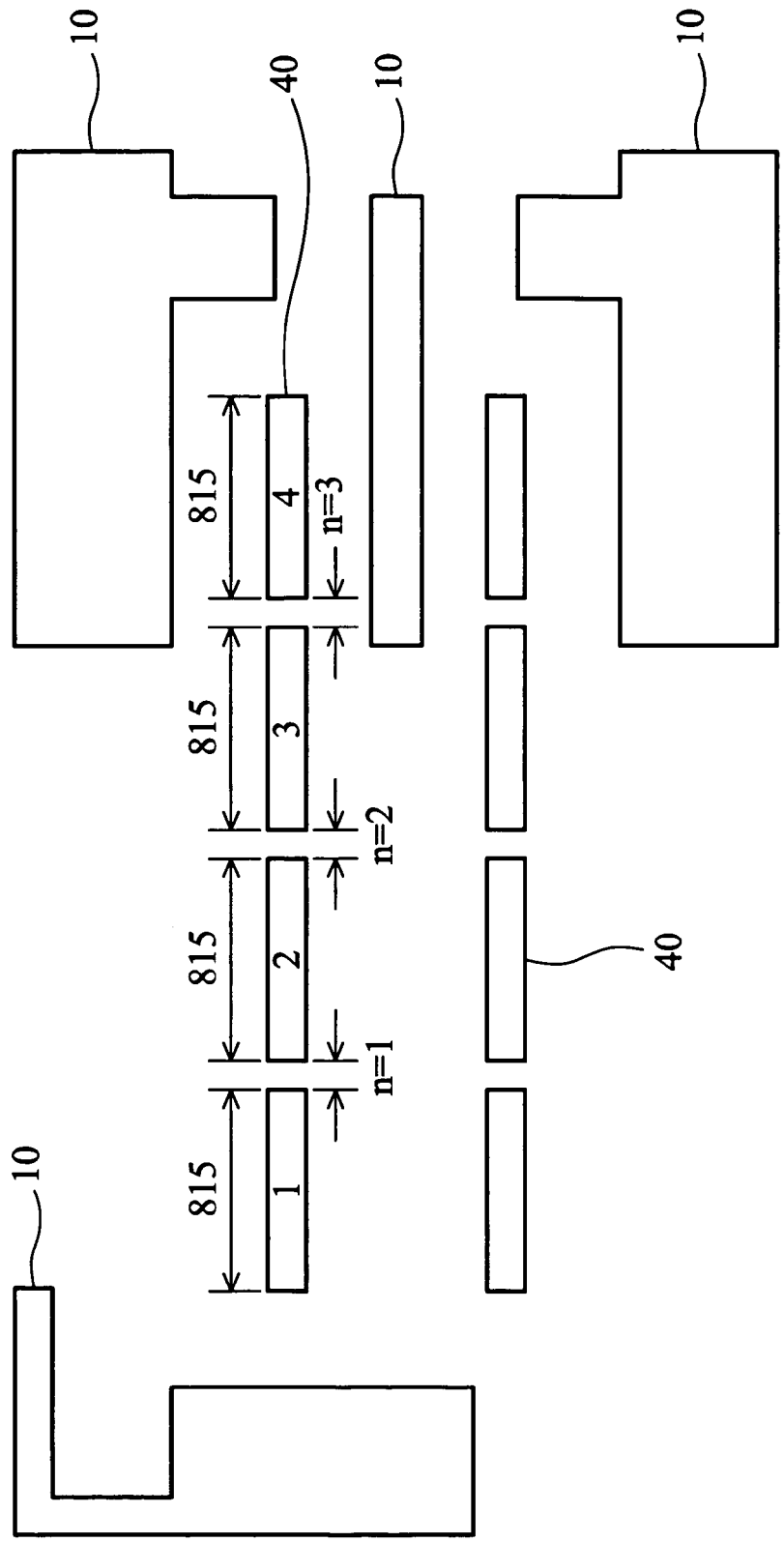
FIG. 3 shows the mask layout portion of FIG. 1 with substantial reduction of ESD after application of the scattering bar method according to one embodiment of the present invention.

Application of Equation (1) will be illustrated with reference to FIG. 3, which shows a mask layout portion of FIG. 1 with substantial reduction of ESD after application of the scattering bar method according to one embodiment of the present invention. Assume that the total scattering bar length $L_t$ is 3680 nm. At step 240, 3680 nm is greater than the length at which the ESD on the scattering bar is not substantially reduced, or about 900 nm, and therefore, the scattering bar needs to be truncated into scattering bar segments and Equation (1) applies. Next at step 250, the number of spaces between scattering bar segments or n is determined, where n=1, 2, 3, . . . . Where n=1, and S=140 nm, Equation (1) yields a $L_{op}$ of 1770 nm. This means that the total scattering bar length is truncated into 2 segments having a space between them of 140 nm, with each segment having an optimized scattering bar length, $L_{op}$ of 1770 nm. At step 260, Lop is compared to the maximum total scattering bar length and if $L_{op}$ is not less than the maximum total scattering bar length, the process returns to step 250 and the process is repeated until $L_{op}$ is less than the maximum total scattering bar length. Each segmented scattering bar still has ESD issues because each has a length of 1770 nm which is still greater than 900 nm. Therefore, the process then returns to step 250, and with n=2 and S=140 nm, Equation (1) yields a $L_{op}$ of 1133 nm, which is still greater than 900 nm. The process is then repeated at step 250 with n=3 and S=140 nm, Equation (1) yields a $L_{op}$ of 815 nm, which is less than 900 nm at step 260 and the process ends. Each of the four segmented scattering bars has a length of 815 nm and three spaces (n=3) of 140 nm each therebetween. If the process is repeated further with n=4, Equation (1) gives a $L_{op}$ of 624. It is understood that although 624 nm is less than 900 nm, the number of spaces between the scattering bar segments have now increased to 4 as compared to when n=3. Ideally, each individual scattering bar segments should have a length less than 900 nm, they should be of equal lengths, and there should be a minimum number of spaces therebetween. If there are too many spaces between each segments there will be too many segments and this will have the undesirable effect of increasing the mask making cycle time. In the above example, where n=3, Equation (1) gives an optimized scattering bar segment length of 815 nm and a minimum number of scattering bar segments and the scattering bar truncation process ends.

It is understood that the optimized scattering bar length with minimum number of segments was calculated above with reference to 90 nm generation node and is shown only for illustrative purposes. Equation (1) is equally applicable to other generation nodes. One skilled in the art understands that the optimized scattering bar length is dependent upon the design rule or design constraints for a particular generation but that Equation (1) cannot violate that design rule.

The new method results in an increase in the number of individual scattering bar segments included in the mask design as single continuous scattering bar designs are replaced with many shorter truncated scattering bars. As noted above, the method and techniques of the present invention for forming segmented scattering bars provides significant advantages over the prior art techniques. One advantage is that the technique of the present invention decreases the occurrence of ESD in the amount of individual scattering bars. Further, the method reduces the occurrence of damaged or deformed scattering bars which can have an unwanted result on the final imaged substrate, such as unwanted extra patterns printed on the substrate. Still further, mask retooling and verification costs are reduced and the risk of yield losses and wafer scraps are decreased. Overall, the method and techniques of the present invention results in a simplification of the mask making process, while simultaneously improving printing performance.

It is noted that the method of the present invention can be implemented in software such that the foregoing methods disclosed therein are automatically performed during the mask making process. For a given computer, the software routines can be stored on a storage device, such as a permanent memory. Alternately, the software routines can be machine executable instructions stored using any machine readable storage medium, such as a diskette, CD-ROM, magnetic tape, digital video or versatile disk (DVD), laser disk, ROM, flash memory, etc. The series of instructions could be received from a remote storage device, such as a server on a network. The present invention can also be implemented in hardware systems, discrete hardware or firmware.

In the preceding detailed description, the present invention is described with reference to specifically exemplary embodiments thereof. It will, however, be evident that various modifications, structures, processes, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method for reducing ESD on scattering bars in forming a mask, the method comprising:
    forming a target pattern on the mask comprising to-be-imaged features;
    forming at least one scattering bar, the at least one scattering bar being placed adjacent to edges of the to-be-imaged features; and
    truncating the scattering bar into one or more scattering bar segments having an optimized length for each of the one or more scattering bar segments, wherein ESD on the one or more scattering bar segments is substantially reduced.

2. The method of claim 1, wherein the optimized scattering bar length $L_{op}$ equals to $(L_t-nS)/(n+1)$ wherein $L_t$ is the total scattering bar length, n is the number of spaces between the scattering bar segments, and S is the minimum space between scattering bar segments.

3. The method of claim 2, wherein the Lop is less than a maximum total predetermined scattering bar length.

4. The method of claim 3, wherein the maximum total predetermined scattering bar length is the length at which the ESD on the scattering bar segment is not substantially reduced.

5. The method of claim 4, wherein the maximum total predetermined scattering bar length is about 900 nm.

6. The method of claim 3, wherein the minimum space between scattering bar segments S is about 140 nm.

7. A computer readable medium, comprising computer executable instructions for perform a sequence of steps for forming a mask, the steps comprising:
    obtaining a target pattern comprising to-be-imaged features;
    modifying the mask to include at least one scattering bar, the at least one scattering bar being placed adjacent to edges of the to-be-imaged features; and
    truncating the scattering bar into one or more scattering bar segments by determining an optimized length for each of the one or more scattering bar segments, wherein ESD on the one or more scattering bar segments is substantially reduced.

8. The computer readable medium of claim 7, wherein the optimized scattering bar length $L_{op}$ is determined by the following equation:

$$L_{op}=(L_t-nS)/(n+1)$$

wherein $L_t$ is the total scattering bar length, n is the number of spaces between the scattering bar segments, and S is the minimum space between scattering bar segments.

9. The computer readable medium of claim 8, wherein determining the optimized scattering bar length further comprises:
    determining whether the $L_t$ is more than a maximum total predetermined scattering bar length;
    if the $L_t$ is more than the maximum total predetermined scattering bar length, obtaining a value for n, wherein n=1, 2, 3, . . . ; and
    determining the Lop, and if the Lop is more than the maximum total predetermined scattering bar length, repeating the obtaining the value for n until the Lop is less than the maximum total predetermined scattering bar length.

10. The computer readable medium of claim 9, wherein the maximum total predetermined scattering bar length is the length at which the ESD on the scattering bar segment is not substantially reduced.

11. An improved mask comprising:
    a target pattern comprising to-be-imaged features; and p1 one or more scattering bar segments being placed adjacent to edges of the features, each of the one or more scattering bar segments having an optimized length, wherein ESD on the one or more scattering bar segments is substantially reduced, and wherein the optimized scattering bar length $L_{op}$ equals to $(L_t-nS)/(n+1)$, wherein $L_t$ is the total scattering bar length, n is the number of spaces between the scattering bar segments, and S is the minimum space between scattering bar segments.

12. The improved mask of claim 11, wherein the optimized scattering bar length is less than a maximum total predetermined scattering bar length.

13. The improved mask of claim 12, wherein the maximum total predetermined scattering bar length is the length at which the ESD on the scattering bar segment is not substantially reduced.

14. An apparatus comprising:
    means for obtaining the target pattern comprising features to be imaged onto a substrate;
    means for modifying the mask to include at least one scattering bar, the at least one scattering bar being placed adjacent to edges of the features to be imaged; and
    means for truncating the scattering bar into one or more scattering bar segments by determining an optimized length for each of the one or more scattering bar segments, wherein ESD on the one or more scattering bar segments is substantially reduced.

15. The apparatus of claim 14, wherein the optimized scattering bar length $L_{op}$ is determined by the following equation:

$$L_{op}=(L_t-nS)/(n+1)$$

wherein $L_t$ is the total scattering bar length, n is the number of spaces between the scattering bar segments, and S is the minimum space between scattering bar segments.

* * * * *